United States Patent [19]
Runaldue et al.

[11] Patent Number: 5,999,441
[45] Date of Patent: Dec. 7, 1999

[54] RANDOM ACCESS MEMORY HAVING BIT SELECTABLE MASK FOR MEMORY WRITES

[75] Inventors: Thomas Jefferson Runaldue; Sambun Boun, both of San Jose, Calif.

[73] Assignee: Advanced Micro Devices, Inc., Sunnyvale, Calif.

[21] Appl. No.: 08/992,796

[22] Filed: Dec. 18, 1997

Related U.S. Application Data

[60] Provisional application No. 60/038,025, Feb. 14, 1997.

[51] Int. Cl.⁶ .................................................. G11C 11/00
[52] U.S. Cl. .................................... 365/154; 365/156
[58] Field of Search .................................... 365/154, 156

[56] References Cited

U.S. PATENT DOCUMENTS

| | | | |
|---|---|---|---|
| 3,971,004 | 7/1976 | Dingwall | 340/173 |
| 4,112,506 | 9/1978 | Zibu | 365/181 |
| 4,985,864 | 1/1991 | Price | 365/189.06 |
| 5,325,325 | 6/1994 | Azuma | 365/156 |
| 5,515,376 | 5/1996 | Murthy et al. | 370/85.13 |
| 5,859,544 | 1/1999 | Norman | 326/40 |

FOREIGN PATENT DOCUMENTS

4120248A1  9/1992  Germany.

*Primary Examiner*—David Nelms
*Assistant Examiner*—M. Tran

[57] ABSTRACT

A random access memory (RAM) having a prescribed number of bits defining a word length includes memory cells that enable selective overwriting on a bit-by-bit basis. Each memory cell includes a logic gate for generating a gating signal in response to a supplied write signal and a bit enable signal. The gating signal selectively connects the bistable latch of the memory cell to a voltage source to enable storage of the supplied data bit. Hence, selected bits can be written to an address word, without overwriting the unselected bits in the stored word, by supplying a mask signal that selectively drives the logic gates of the selected bits. The mask signal can also be used to configure a RAM as a dynamic-width memory, enabling use of the RAM for variable-width storage applications without the necessity of external decoding logic.

8 Claims, 4 Drawing Sheets

DATA_IN     1111 1111

MASK[0:7]   1010 1010

DATA_IN    XXXX 1010

MASK       0000 1111

⇓ WE = 1

W1:        0000 1010
```

RANDOM ACCESS MEMORY HAVING BIT SELECTABLE MASK FOR MEMORY WRITES

RELATED APPLICATIONS

This application claims priority from provisional patent application Ser. No. 60/038,025, filed Feb. 14, 1997, entitled INTEGRATED MULTIPORT SWITCH (attorney docket 1033-230PRO), which is incorporated herein by reference.

BACKGROUND OF THE INVENTION

1. Technical Field

The present invention relates to apparatus and methods for writing a selected bit of a word into a random access memory (RAM) having a prescribed number of bits defining a word length.

2. Background Art

Memory architectures are typically configured to store a prescribed number of words having a predetermined word length. Such memory structures, known as word organized arrays, have a prescribed number of columns and rows, where the column length (i.e., the number of rows) equals the number of words, W, and the row length (i.e., the number of columns) equals the number of bits per word. Word selection is thus performed using a one-out-of-W decoder. i.e., a decoder with a mutually exclusive output for each word in the memory. The address inputs to the decoder select one and only one of the decoder's outputs, thus selecting one word in the memory array. Address decoder size may be reduced using two-level decoding, where one level corresponds to a physical word and another to a logical word, such that the physical word consists of the number of bits in a row of the memory array, and the logical word consists of the number of bits of a physical word which are sensed and gated to the output at one time.

Hence, the reading and writing of data to and from a memory array involves addressing a word of memory based on its corresponding address, and reading and/or writing the word having the prescribed number of bits from the memory array.

Applications using random access memories for storing configuration data may store multiple configuration parameters within a single data byte. For example, a configuration word may be stored as a single byte (8-bits) having multiple fields of one or more bits. For example, a word may have eight 1-bit configuration values, requiring external logic to ensure that selected bits of a stored word are not overwritten.

Hence, resetting a bit of a configuration word stored in memory must typically be performed on a per-byte basis, where a selected bit is reset by addressing the word, reading the contents from memory, modifying the contents of the retrieved data word using external logic, and rewriting the modified word back into memory. Thus, this read-modify-write technique requires at least three clock cycles to modify a single bit in the memory configured for reading and writing on a per-byte basis, and requires additional external logic that increases the size and cost of the IC chip.

DISCLOSURE OF THE INVENTION

There is a need for an arrangement for enabling data to be written in an addressed word in memory on a bit-by-bit basis.

There is also a need for an arrangement for selectively reducing a width of a RAM having a prescribed width to a narrower width without requiring custom circuitry.

There is also a need for an arrangement enabling a RAM to have a dynamically configurable width.

There is also a need for an arrangement enabling selected bits of a data word to be selectively written into a random access memory without overwriting other non-selected bits of the data word stored in the memory.

These and other needs are attained by the present invention, where a bit-selectable mask enables each bit of a data input to be selectively written into a corresponding memory cell, where the memory cell includes a logic circuit for selectively overwriting a stored value based on the corresponding bit of the mask.

According to one aspect of the present invention, a static random access memory (SRAM) cell includes metal oxide semiconductor (MOS) transistors forming a bistable latch configured for storing a supplied data input, first and second supply transistors configured for selectively connecting the bistable latch to a voltage source in response to first and second gate signals, respectively, and a logic circuit configured for generating the first and second gate signals in response to a write signal and a bit enable signal, the bistable latch storing the supplied data input in response to connection to the voltage source by the first and second supply transistors. The logic circuit selectively causes the bistable latch to overwrite a stored value based upon the write signal and the corresponding bit enable signal. Hence, a random access memory can be fabricated, where word-based addressing can be used to access a selected memory location, while using a mask signal to write selected bits in the address memory word, without overwriting unselected bits of the addressed word.

Another aspect of the present invention provides a random access memory circuit comprising an array of memory cells arranged in a first number of columns having a second number of rows, each column of memory cells addressed by a corresponding set of bit lines and each row of cells addressed by a corresponding word line, each memory cell including a logic gate for generating a gating signal in response to a supplied write signal and a bit enable signal, the gating signal causing the corresponding memory cell to overwrite a stored data value with a supplied data value, and control logic for supplying the bit enable signal to a selected group of said columns in response to a mask signal. The control logic provides maximum flexibility in the configuration of the array, enabling the random access memory circuit to be configured as a variable-width memory without the necessity of additional external decoding logic. Moreover, the control logic enables selected bits of an addressed word to be written to, without overwriting unselected bits in the addressed word. Hence, individual bits of an addressed word may be modified within a single clock cycle, without the necessity of performing a read-modify-write sequence of operations requiring at least three clock cycles plus external logic to manipulate the individual bits of the addressed word.

Still another aspect of the present invention provides a method of selectively writing a data value to a static random access memory (SRAM) cell having a bistable latch, comprising supplying the data value to the bistable latch, and selectively connecting the bistable latch to a voltage source to cause writing of the data value into the bistable latch in response to a write data signal and a bit enable signal. Selective connection of the bistable latch to the voltage source ensures that overwriting of data can be avoided, despite assertion of the appropriate address and write enable signals, by preventing connection of the bistable latch to a voltage source which would otherwise change the state of the bistable latch.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein:

FIGS. 4A and 4B are diagrams illustrating the arrangement for writing selected bits of an addressed data word into memory according to an embodiment of the present invention.

DETAILED DESCRIPTION OF ILLUSTRATED EMBODIMENTS

Figure 1:
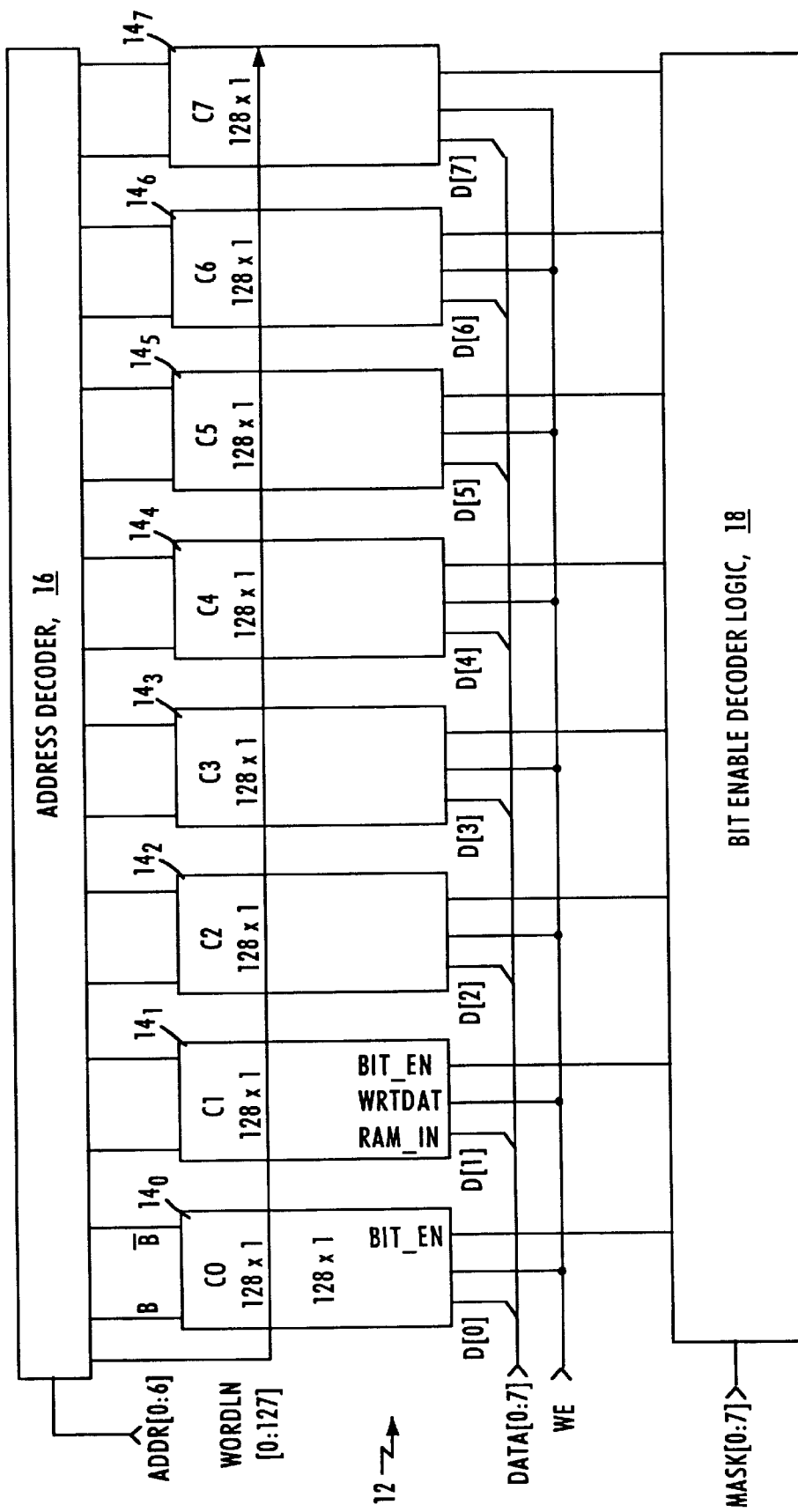
FIG. 1 is a diagram illustrating an exemplary random access memory implementing the SRAM cells enabling bit-by-bit writing using a mask signal according to an embodiment of the present invention.

FIG. 1 is a block diagram illustrating a 128×8 RAM having a variable width configuration in accordance with an embodiment of the present invention. The RAM 10 is composed of an array of memory cells 12 arranged in eight columns 14 (C0–C7), where each column 14 is a 128 by 1-bit array of SRAM cells. The RAM 10 also includes an address decoder 16 and bit enable decoder logic 18, described below. The address decoder 16 is configured as a conventional 128 by 8-bit decoder, where the address decoder 16 asserts a selected one of the word lines (WORDLN[0:127]) in response to the 7-bit address signal (ADDR). The address decoder also asserts the bit line B, B# (i.e., "NOT B"=B#) on each of the columns 14. Hence, the RAM 10 may operate as a conventional memory, where each bit of the input data (DATA[0:7]) is written into a corresponding column array 14 at a selected row specified by a corresponding one of the word lines (WORDLN) and in response to the write enable signal (WE). According to prior art techniques, applications requiring setting or resetting of a specific bit within an addressed word would require the entire data word (e.g., bits C0–C7 of a selected row) to be output using a sensing circuit (not shown), modifying the selected bit using external logic, and rewriting the word having the modified bit back into the addressed memory location on a word-by-word basis.

According to the disclosed embodiment, each memory cell in each column 14 includes a logic gate, described below, for generating a gating signal in response to the supplied write enable signal (WE) and a bit enable signal (BIT_EN) output by the bit enable decoder logic 18. The gating signal for each SRAM cell enables that cell to overwrite a stored data value with the corresponding data bit from the data bus. As described below, the bit enable decoder logic 18 may output a unique bit enable signal to each column 14 to enable writing to an addressed word on a bit-by-bit basis or may output the same bit enable signal to a selected group of columns to provide variable-width memories, for example converting an 8-bit wide RAM to two 4-bit (i.e., nibble-wide) memory arrays, or four 2-bit memory arrays.

Figure 2:
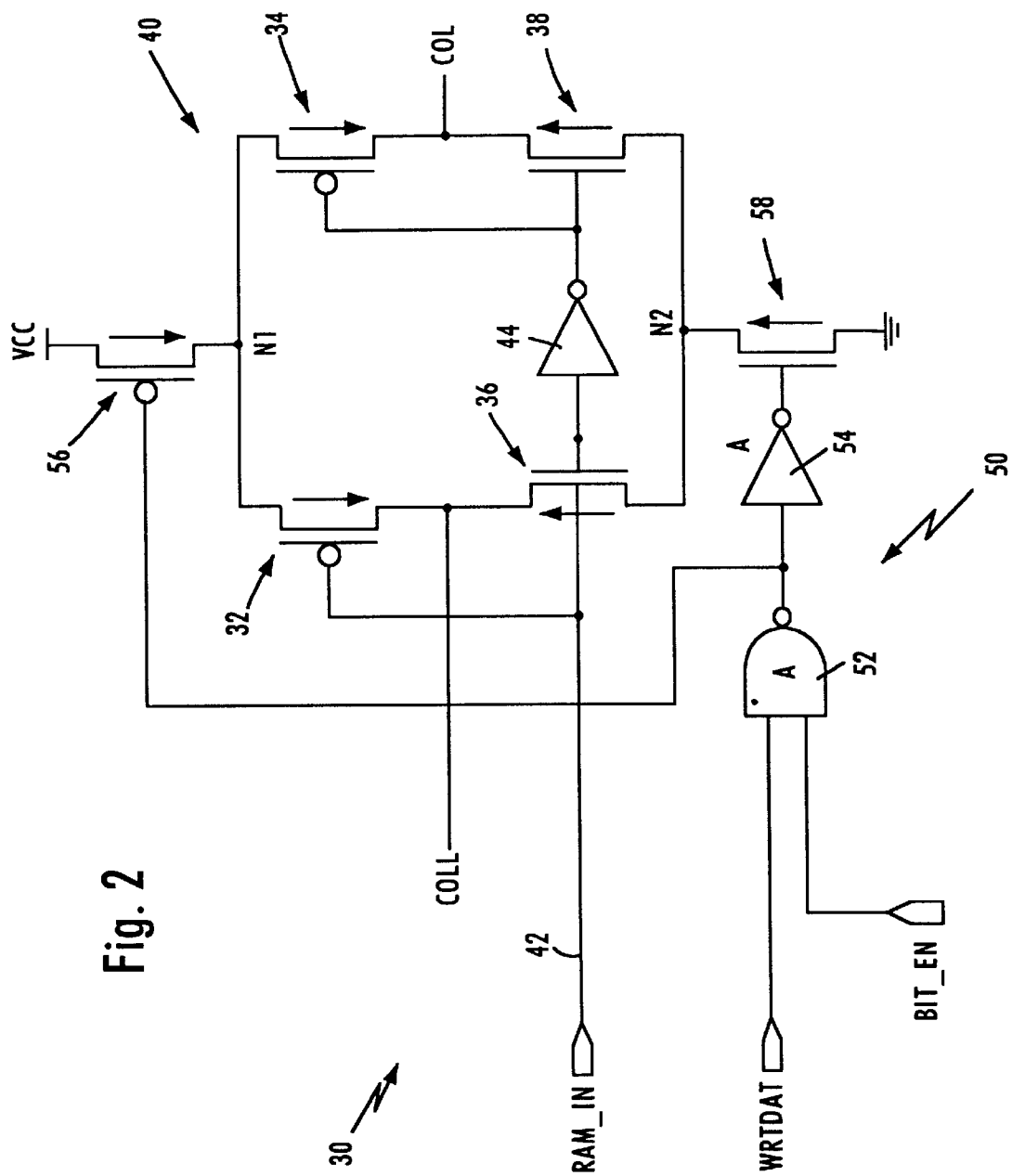
FIG. 2 is a circuit diagram illustrating in detail the SRAM cell according to the embodiment of the present invention.

FIG. 2 is a circuit diagram illustrating an exemplary SRAM cell 30 from one of the arrays 14 according to an embodiment of the present invention. As shown in FIG. 2, the SRAM cell 30 includes PMOS load transistors 32 and 34, and NMOS supply transistors 36 and 38. The four transistors 32, 34, 36, and 38 are preferably metal oxide semiconductor (MOS) transistors, and form a bistable latch 40 for storing a data input supplied on the input signal path 42 (RAM_IN), as described below.

The SRAM cell 30 also includes an inverter 44 configured for generating an inverted data input in response to the data supplied on the input supply line 42. Hence, the gates of transistors 32 and 36 receive the input RAM_IN and the gates of the transistors 34 and 38 receive the inverted input RAM_IN#.

The SRAM cell also includes a logic circuit 50 configured for generating gating signals in response to the write enable signal (WRTDAT) and a bit enable signal (BIT_EN), where the gating signal causes the SRAM cell 30 to selectively overwrite a stored data value with the supplied data value. Specifically, the logic circuit 50 includes a NAND gate 52 and a NOT gate (i.e., an inverter) 54 driving the gates for a PMOS supply transistor 56 and an NMOS supply transistor 58 respectively. The PMOS supply transistor 56 has a source connected to VCC and a drain connected to node N1, and the NMOS supply transistor 58 has a source connected to ground and a drain connected to a second node N2 of the bistable latch 40.

If the nodes N1 and N2 are connected to VCC and ground, respectively, then the bistable latch 40 will write any data asserted on the data input line 42. Although not shown, the data input line 42 will also include external gating transistors that selectively supply the input in response to address selection signals for the corresponding addressed word (e.g., the word line signals and the bit line signals). According to the disclosed embodiment, the write enable signal (WRTDAT) is selectively controlled on a bit-by-bit basis using the logic circuit 50 to drive the supply transistors 56 and 58. Specifically, simultaneous assertion of the write enable (WRTDAT) and bit enable (BIT_EN) signals causes the NAND gate 52 to output a "0", turning on the PMOS transistor 56 to connect the node N1 to VCC. The "0" value output by the NAND gate 52 is inverted by the inverter 54 to a "1", which drives the NMOS transistor 58 to connect the node N2 of the bistable latch 40 to ground. The bistable latch 40 can then store the data supplied on the data input line 42 once the nodes N1 and N2 are connected to VCC and ground, respectively.

Assuming the data line 42 has a logic "1" to be written into the bistable latch 40, the "1" on the data line 42 asserts a "1" on the gates of driver transistor 36 and load transistor 32, turning on transistor 36 and turning off transistor 32. The inverter 44 concurrently outputs a logic "0", turning off NMOS transistor 38 and turning on PMOS transistor 34. Hence, a "1" (VCC) potential is reached at the first column sense line (COL) and a logic 0 (ground) potential is reached at the complementary column sense line (COLL), resulting in storage of the input data value.

Upon deassertion of either the write data (WRTDAT) or bit enable (BIT EN) line, the transistors 56 and 58 are turned off, disconnecting the bistable latch 40 from the voltage source between VCC and ground, preventing the stored value in the bistable latch from being overwritten by any subsequent changes on the input data path 42.

Hence, the SRAM cell 30 of FIG. 2 includes the logic circuit 50 to selectively connect the corresponding bistable latch to the voltage source, enabling writing of data on a bit-by-bit basis within each SRAM cell, while at the same time preventing overwriting of a stored data value by disconnecting the nodes N1 and N2 from VCC and ground, respectively.

Figure 3A:
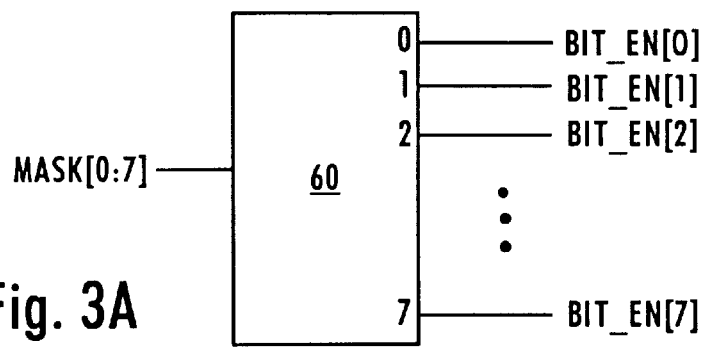
FIGS. 3A, 3B and 3C are diagrams illustrating alternative implementations of the bit enable decoder logic of FIG. 1.
Figure 3B:
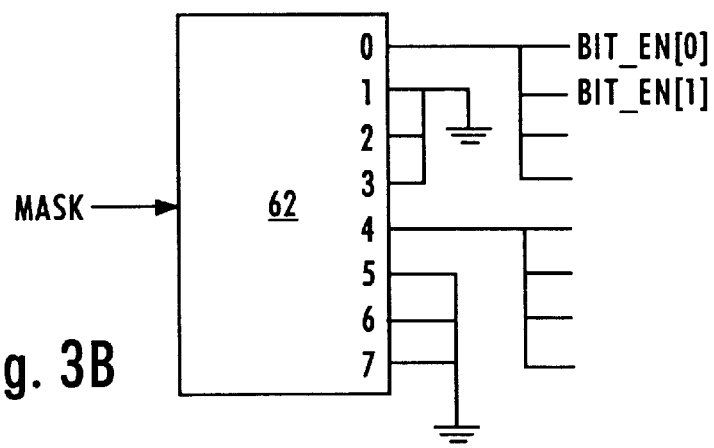
Figure 3C:
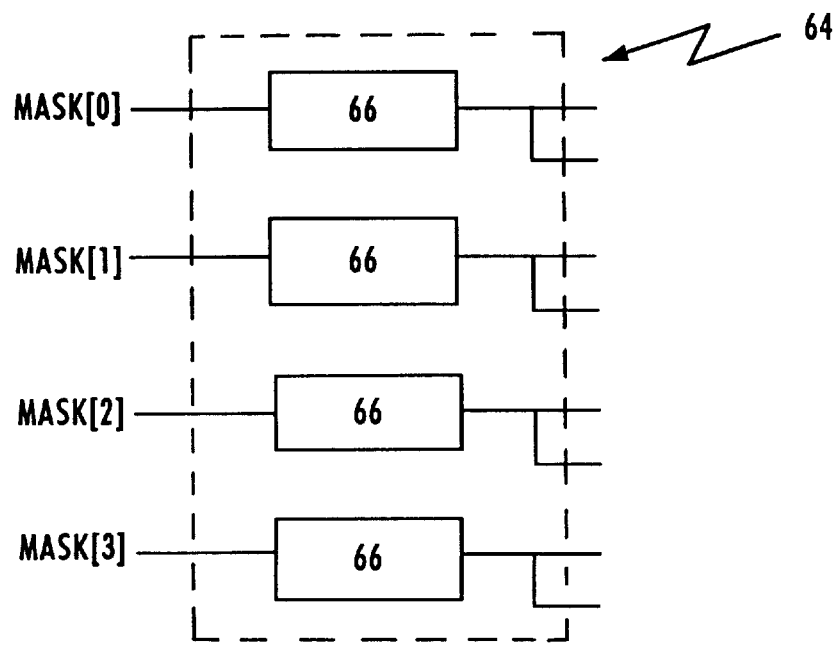

FIGS. 3A, 3B, and 3C are diagrams illustrating alternative implementations of the bit enable decoder logic 18. As described above, the bit enable signal supplied to each of columns 14 may be arranged with different decoding logic, depending on the application. For example, FIG. 3A illustrates a decoder 60 that passes each bit of the 8-bit mask signal to a corresponding one of the columns 14 to provide a bit-by-bit mask writing capability, illustrated in FIG. 4A below. Hence, the writing of each bit in an addressed word (W1) is controllable on a bit-by-bit basis based upon the corresponding bit in the mask word.

FIG. 3B illustrates an alternative arrangement for selectively writing data to a lower nibble or upper nibble of the RAM 10, enabling the 1-bit mask signal of FIG. 3B to be used as an additional addressing signal for nibble-wide data. Alternatively, the decoder 62 can be configured to configure the RAM as a full 8-bit wide RAM if mask equals 1 to assert all the bit enable signals for all the columns C0–C7, and assert only the lower nibble (or upper nibble) if the mask signal equals zero as shown in FIG. 4B.

FIG. 3C illustrates still another arrangement, where the decoder circuitry 64 includes a plurality of decoders 66 that selectively output a bit enable signal to two of the columns 14 in response to a corresponding mask signal. Hence, the mask signal mask[0:3] can be used to selectively configure the RAM based on bit pairs.

According to the disclosed embodiment, an SRAM cell includes a logic circuit that selectively connects the bistable latch to a voltage supply in response to a bit enable signal, enabling formation of a random access memory that can write data on a bit-by-bit basis onto an addressed word. Hence, users may configure the RAM 10 as a variable-width memory without the necessity of adding any custom circuitry or additional decoding logic. Moreover, data can be written to an addressed word on a bit-by-bit basis using a single write cycle, as opposed to performing a read-modify-write sequence of operations.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A static random access memory (SRAM) cell, comprising:

metal oxide semiconductor (MOS) transistors forming a bistable latch configured for storing a supplied data input;

first and second supply transistors configured for selectively connecting the bistable latch to a voltage source in response to first and second gate signals, respectively; and a logic circuit configured for generating the first and second gate signals in response to a write signal and a bit enable signal, the bistable latch storing the supplied data input in response to connection to the voltage source by the first and second supply transistors.

2. The SRAM cell of claim 1, wherein the logic circuit comprises a first logic gate for outputting the first gate signal in response to the write signal and the bit enable signal, and a second logic gate for outputting the second gate signal complementary to the first gate signal.

3. The SRAM cell of claim 2, wherein the first logic gate is a NAND gate and the second logic gate is a NOT gate.

4. The SRAM cell of claim 2, wherein:

the first gate signal selectively causes the first supply transistor to connect a first node of the bistable latch to a voltage supply node; and the second gate signal selectively causes the second supply transistor to connect a second node of the bistable latch to ground.

5. The SRAM cell of claim 4, wherein a first and second of the MOS transistors are load transistors and third and fourth of the MOS transistors are driver transistors for the bistable latch, each of the MOS transistors having a corresponding source, drain and gate, the first node connecting the sources of the first and second MOS transistors and the second node connecting the sources of the third and fourth MOS transistors.

6. The SRAM cell of claim 1, wherein a first and second of the MOS transistors are driver transistors, the SRAM cell further comprising an inverter configured for generating an inverted data input in response to the data input, the first MOS transistor receiving the data input as a gate input and the second MOS transistor receiving the inverted data input as a gate input.

7. A method of selectively writing a data value to a static random access memory (SRAM) cell having a bistable latch, comprising:

supplying the data value to the bistable latch; and selectively connecting the bistable latch to a voltage source to cause writing of the data value into the bistable latch in response to a write data signal and a bit enable signal.

8. The method of claim 7, wherein the selectively connecting step comprises:

supplying the write data signal and a bit enable signal to a logic gate within the SRAM cell; and supplying a gating signal generated by the logic gate as a gate signal to supply transistors configured for connecting the bistable latch to the voltage source.

* * * * *